United States Patent
Zeidman et al.

(10) Patent No.: US 7,900,187 B2
(45) Date of Patent: Mar. 1, 2011

(54) USING READILY AVAILABLE DRIVER AND APPLICATION SOURCE CODE WITH A SYNTHESIZED OPERATING SYSTEM

(75) Inventors: Robert M. Zeidman, Cupertino, CA (US); Gregory Snider, Mountain View, CA (US)

(73) Assignee: Robert Zeidman, Cupertino, CA (US)

( * ) Notice: Subject to any disclaimer, the term of this patent is extended or adjusted under 35 U.S.C. 154(b) by 1256 days.

(21) Appl. No.: 11/411,738

(22) Filed: Apr. 25, 2006

(65) Prior Publication Data

US 2006/0253832 A1      Nov. 9, 2006

Related U.S. Application Data (63) Continuation-in-part of application No. 10/688,573, filed on Oct. 20, 2003, now Pat. No. 7,882,488.

(51) Int. Cl.
  *G06F 9/44* (2006.01)
  *G06F 9/46* (2006.01)
(52) U.S. Cl. .................................. 717/106; 718/100
(58) Field of Classification Search ............... None
See application file for complete search history.

(56) References Cited

U.S. PATENT DOCUMENTS

| | | | |
|---|---|---|---|
| 5,754,858 A * | 5/1998 | Broman et al. | 717/111 |
| 6,934,740 B1 * | 8/2005 | Lawande et al. | 709/213 |
| 6,938,079 B1 * | 8/2005 | Anderson et al. | 709/222 |
| 2003/0033446 A1 * | 2/2003 | Noden | 709/328 |
| 2004/0226000 A1 * | 11/2004 | Finch | 717/114 |
| 2005/0223383 A1 * | 10/2005 | Tetrick | 718/104 |
| 2008/0244599 A1 * | 10/2008 | Hodson et al. | 718/104 |
| 2008/0288939 A1 * | 11/2008 | DeHaan | 717/177 |

OTHER PUBLICATIONS

Paul Riskin, "Zeidman Technologies Releases Software for Synthesizing a Real-Time Operating System", Nov. 24, 2003, Zeidman Technologies, pp. 1-2.*
Hessel et al., "Abstract RTOS Modeling for Embedded Systems", 2004 IEEE, pp. 1-7.*
Bob Zeidman, "Software Synthesis for Embedded Systems", Jan. 20, 2005, Embedded Systems Design <Embedded.com>, pp. 1-10.*
Wang et al., "Synthesizing Operating System Based Device Drivers in Embedded Systems", 2003 ACM, pp. 37-44.*

* cited by examiner

*Primary Examiner* — Michael J Yigdall
*Assistant Examiner* — Ben C Wang
(74) *Attorney, Agent, or Firm* — Jim H. Salter (57) ABSTRACT

Software that modifies the source code for readily available software tasks—typically applications and hardware drivers—so that a small, fast, reliable operating system can be synthesized to control execution of these readily available software tasks.

6 Claims, 6 Drawing Sheets

| POSIX Thread Manipulation | |
|---|---|
| pthread_create | pthread_join |
| pthread_self | pthread_equal |
| pthread_cancel | pthread_getconcurrency |
| pthread_setcancelstate | pthread_setconcurrency |
| pthread_setcanceltype | pthread_getschedparam |
| pthread_testcancel | pthread_setschedparam |
| pthread_exit | pthread_getspecific |
| pthread_cleanup_push | pthread_setspecific |
| pthread_cleanup_pop | pthread_once |
| pthread_detach | |

Figure 5

| POSIX Thread Attribute | |
|---|---|
| pthread_attr_getstackaddr | pthread_attr_destroy |
| pthread_attr_getstacksize | pthread_attr_init |
| pthread_attr_setstackaddr | pthread_attr_getdetachstate |
| pthread_attr_setstacksize | pthread_attr_getinheritsched |
| pthread_attr_getguardsize | pthread_attr_getschedparam |
| pthread_attr_setguardsize | pthread_attr_setschedparam |
| pthread_attr_getscope | pthread_attr_getschedpolicy |
| pthread_attr_setscope | pthread_attr_setschedpolicy |

Figure 6

| POSIX Mutex Manipulation | |
|---|---|
| pthread_mutex_destroy | pthread_mutex_lock |
| pthread_mutex_init | pthread_mutex_trylock |
| pthread_mutex_getprioceiling | pthread_mutex_unlock |
| pthread_mutex_setprioceiling | |

Figure 7

| POSIX Mutex Attribute | |
|---|---|
| pthread_mutexattr_destroy | pthread_mutexattr_setprotocol |
| pthread_mutexattr_init | pthread_mutexattr_getpshared |
| pthread_mutexattr_getprioceiling | pthread_mutexattr_setpshared |
| pthread_mutexattr_setprioceiling | pthread_mutexattr_gettype |
| pthread_mutexattr_getprotocol | pthread_mutexattr_settype |

Figure 8

| POSIX Condition Variables | |
|---|---|
| pthread_cond_destroy | pthread_cond_signal |
| pthread_cond_init | pthread_cond_timedwait |
| pthread_cond_broadcast | pthread_cond_wait |

Figure 9

| POSIX Condition Attributes | |
|---|---|
| pthread_condattr_destroy | pthread_condattr_getpshared |
| pthread_condattr_init | pthread_condattr_setpshared |

Figure 10

| POSIX Data Keys | |
|---|---|
| pthread_key_create | pthread_key_delete |

Figure 11

| POSIX Read/Write Locks | |
|---|---|
| pthread_rwlock_destroy | pthread_rwlock_trywrlock |
| pthread_rwlock_init | pthread_rwlock_unlock |
| pthread_rwlock_rdlock | pthread_rwlock_wrlock |
| pthread_rwlock_tryrdlock | |

Figure 12

| POSIX Read/Write Lock Attributes | |
|---|---|
| pthread_rwlockattr_destroy | pthread_rwlockattr_getpshared |
| pthread_rwlockattr_init | pthread_rwlockattr_setpshared |

Figure 13

USING READILY AVAILABLE DRIVER AND APPLICATION SOURCE CODE WITH A SYNTHESIZED OPERATING SYSTEM

CROSS-REFERENCE TO RELATED PATENT APPLICATION

The present application is a continuation-in-part application of copending U.S. patent application, entitled "Software tool for synthesizing a real-time operating system," Ser. No. 10/688,573, filed on Oct. 20, 2003, now U.S. Pat. No. 7,882,488.

BACKGROUND OF THE INVENTION

The open source movement is having an increasing influence on the software industry and all software development. This movement consists of individual programmers and companies that create software and release the original source code to the public without charge. This source code is released to allow compilation for running on all kinds of computer systems. The software often includes common applications such as word processors and spreadsheets, and drivers for use with specific hardware in a system.

The major driving force behind the open source movement is specifically the LINUX operating system ("LINUX"). This open source operating system is growing in influence as it is being deployed by many different individuals and companies. Along with this growing acceptance, in order to compete with commercial operating systems such as WINDOWS from MICROSOFT, the complexity of LINUX is also growing to allow it to run on larger systems and to control complex multitasking systems. This increasing complexity inevitably results in decreasing reliability, larger memory requirements, and a slower response time to critical situations (i.e., latency time).

While this growth in complexity is beneficial for desktop systems and web hosting systems, it is detrimental for systems that require high reliability, small memory, and short latency. Critical systems such as medical equipment require high reliability. Systems on a chip (SOCs) require small memory footprints. Real-time embedded systems require short latency. While a number of vendors are now offering versions of "embedded LINUX," these LINUX systems are all distinct, semi-proprietary operating systems that still have large memory requirements, long latency times, and inadequate reliability. Embedded system designers need the open source drivers and applications to run on an operating system that is smaller, faster, and more reliable than the existing off-the-shelf operating systems.

SUMMARY OF THE INVENTION

The present invention modifies the source code for readily available software tasks—typically, applications and hardware drivers—so that a small, fast, reliable operating system can be synthesized to control execution of these readily available software tasks. The present invention provides a method and apparatus for searching the task source code for operating system application program interfaces ("APIs") and replacing them with simple statements called "primitives" that are understood by a software synthesis program. The present invention provides a method and apparatus for also searching the task source code for data structures such as mutexes, semaphores, mailboxes, and message queues, and substituting primitives, so that source code for declaring, instantiating, and accessing these data structures can be synthesized by a software synthesis tool.

DETAILED DESCRIPTION

The present invention is understood more fully from the detailed description given below and from the accompanying drawings of the preferred embodiments of the invention, which, however, should not be taken to limit the invention to the specific embodiments but are provided for illustration, explanation and understanding only.

One embodiment of the invention relies on a software synthesis program to perform the synthesis step (i.e., generating system-specific source code that can be directly compiled into an executable program that runs on a particular computer system). In this embodiment, the present invention modifies task source code such that the modified source code can be used as input data for such a software synthesis program. One example of such a suitable synthesis program is the SynthOS program from ZEIDMAN TECHNOLOGIES. The principles of operation of the SynthOS program are disclosed, for example, in U.S. Pat. No. 6,934,947, entitled "Visual Tool for Developing Real Time Task Management Code," filed on May 10, 1999 and U.S. patent application Ser. No. 10/688,573 entitled "Software tool for synthesizing a real-time operating system," filed on Oct. 20, 2003. Relevant features of SynthOS are described in the following sections.

1. Task Types

SynthOS synthesizes source code to control tasks in a real-time operating system (RTOS). To specify the tasks to be synthesized, SynthOS primitives are used to specify task management functions in a source input file. SynthOS recognizes several types of tasks that are discussed below. The specific parameters associated with each task are defined in a task section of a SynthOS Project (SOP) file, which is an input configuration file used by the SynthOS program.

(a) Call Task

A Call task is a task that is not executed unless it is specifically started by an executing task ("calling task"). A SynthOS_call( ) or SynthOS_start( ) primitive may be used to start execution of the Call task.

(b) Init Task

An Init task is executed once during the initialization of the software. It can also be started by an executing task just like a Call task (i.e., using a SynthOS_call( ) or SynthOS_start( ) primitive to start execution of the Init task).

(c) Loop Task

A Loop task is executed by the task management code using an algorithm defined by the scheduler, as specified in the SOP file.

2. SynthOS Primitives

SynthOS primitives are placed in the source code to specify task management and communication between tasks. For example, a SynthOS primitive is used in a first task to start execution of a second task while passing data to the second task and receiving data back from the second task. SynthOS primitives are styled after C language function calls and they are used in the code in a manner similar to operating system (OS) calls in a traditional RTOS. The next section explains the syntax for each of the following SynthOS primitives:

---
(a)SynthOS_call
(b)SynthOS_check
(c)SynthOS_sleep
(d)SynthOS_start
(e)SynthOS_wait
---

Note that SynthOS primitives can be inferred by SynthOS during synthesis (i.e., the "inferred" SynthOS primitives are specified implicitly). In those cases, the primitives are not needed but may be used for clarity within the code.

---
(a) SynthOS_call
Syntax:
    SynthOS_call(Taskname(a, b, c, . . .));
    Retval = SynthOS_call(Taskname(a, b, c, . . .));
Alternate syntax:
    Retval = Taskname(a, b, c, . . .);
where:
    Taskname is the name of the task being called;
    a, b, c, . . . are the parameters of the called
        task; and
    Retval is the return value from the called task.
---

The SynthOS_call primitive is a "blocking" primitive, which means that execution of the current task is suspended until some later time when a condition is met. In the case of SynthOS_call, the condition is the completion of the called task.

The SynthOS_call primitive begins execution of another task (Taskname in the examples above) while suspending execution of the calling task until the called task has completed. In the first example above, where the return value is not specified, the called task does not return a value. In the second and third examples, the called task returns a value in variable Retval.

In the third example, using the alternative syntax, the SynthOS_call primitive is inferred from the task identifier Taskname, which is declared as a Call task in the SynthOS project file (SOP file). Because the task returns a value, the calling task cannot continue until the called task (i.e., Taskname) has completed execution and returned the value.

Note that if several tasks call the same Call task, the call requests are queued in the order in which they occur; only one instance or context of a given Call task may execute at a time. The SynthOS_start primitive, discussed below, begins executing the called task without suspending the calling task.

---
(b) SynthOS_check
Syntax:
    Flag = SynthOS_check(Taskname);
Where:
    Taskname is the name of the task being checked;
        and
    Flag is a Boolean variable representing whether
        the task Taskname is currently executing
        (true) or not (false).
---

The SynthOS_check is a "non-blocking" primitive that checks whether a Call task is currently executing. In executing a non-blocking primitive, the calling task continues execution and does not wait for the called task to complete. SynthOS_check returns true if the task specified (i.e., Taskname) is executing, false if all instances of the task have completed execution. If several different tasks call Taskname, SynthOS_check(Taskname) returns true if any instance of Taskname is scheduled for execution. If the user desires to know if a specific instance of a Call task is executing, it is recommended that the user invoke that Call task only from one other task or create another mechanism, such as using global variables to identify different instances of the Call task.

---
(c)SynthOS_sleep
Syntax:
    SynthOS_sleep( );
---

SynthOS_sleep is a blocking primitive. SynthOS_sleep blocks the calling task and returns execution control to the RTOS. The calling task may resume execution at a later time as determined by the RTOS. This primitive may be thought of as a voluntary "preemption point" that allows the scheduler to reschedule a higher priority task that is ready to run. Inserting SynthOS_sleep( ) primitives in long sections of code can increase the responsiveness of the system. At a suitable later time, the RTOS restarts execution of the calling task from the point following the SynthOS_sleep primitive. The time at which execution of the calling task resumes is determined by the operating system according to its scheduling algorithm, the priority of the calling task, and the priorities of other tasks waiting to execute.

---
(d) SynthOS_start
Syntax:
    SynthOS_start(Taskname(a, b, c, . . .));
Alternate syntax:
    Taskname(a, b, c, . . .);
Where:
    Taskname is the name of the called task; and
    a, b, c,. . . are the parameters for the called
        task.
---

The SynthOS_start primitive is a non-blocking primitive that begins execution of another task (Taskname in the example) without suspending execution of the calling task. In the alternative example, the SynthOS_start primitive is inferred from Taskname, which is declared as a Call task in the SynthOS project file (SOP file). Because the task does not return a value, the calling task can immediately continue execution without suspension after the called task begins execution.

(e)SynthOS_terminate
Syntax:
    SynthOS_terminate( );
    SynthOS_terminate(Taskname);
Where:
    Taskname is the name of the task to terminate.

SynthOS_terminate is a non-blocking primitive. SynthOS_ terminate terminates execution of a task. If a task is specified, such as Taskname, that task is terminated. If no task is specified, the calling task is terminated.

(f) SynthOS_wait
Syntax:
    SynthOS_wait(Taskname);
    SynthOS_wait(Condition);
Where:
    Taskname is the name of the task being checked;
    and
    Condition is any legal C expression (e.g.,
        var1*sin(x) < 5).

The SynthOS_wait primitive is a blocking primitive that suspends execution of the calling task until Taskname is idle (in the first example) or when Condition becomes true (in the second example). Condition can be any legal C expression using constants and global variables such as (x==i*j+5). Note that, when waiting for a task to complete, the SynthOS_wait primitive does not begin execution of Taskname. If execution of Taskname needs to be started, the SynthOS_call primitive can be used to both start Taskname and wait for it to finish executing. If several different tasks call the same Call task, the SynthOS_wait primitive blocks until the last instance of that Call task completes. If the user desires to block until a specific instance of a Call task completes, it is recommended that the user invoke that Call task from only one task or create another mechanism, such as using global variables to identify different instances of the Call task.

When the SynthOS_wait primitive is used to wait for a condition, the calling task is suspended until the specified condition becomes true. Note that the condition may become false again immediately after the primitive is executed. This is because multiple tasks are effectively running simultaneously. For example, one event in one task may cause the condition to become true, causing the calling task to continue executing. However, even before the calling task can execute the next line of its code, another task may have already caused the condition to become false again.

3. SynthOS Project File

The SynthOS project file is a user-defined text file that has the name ProjectName.sop, where ProjectName is the name of the project. The SynthOS project file is a listing of tasks and their properties expressed in a number of fields. Each field has a default value if the user does not specify an explicit value, so the user need only specify those fields that are relevant to the application.

4. Task Operations

The code synthesized by SynthOS supports the task operations discussed in this section. At run time, each task has an associated task context block (TCB) structure in memory. A TCB contains the current task state, a pointer to the return value if the task returns a value, an identifier (ID) that identifies the calling task (i.e., a pointer to the queue (TCBQ) of TCBs associated with the calling task), and the parameters that are passed to the task.

Figure 1:
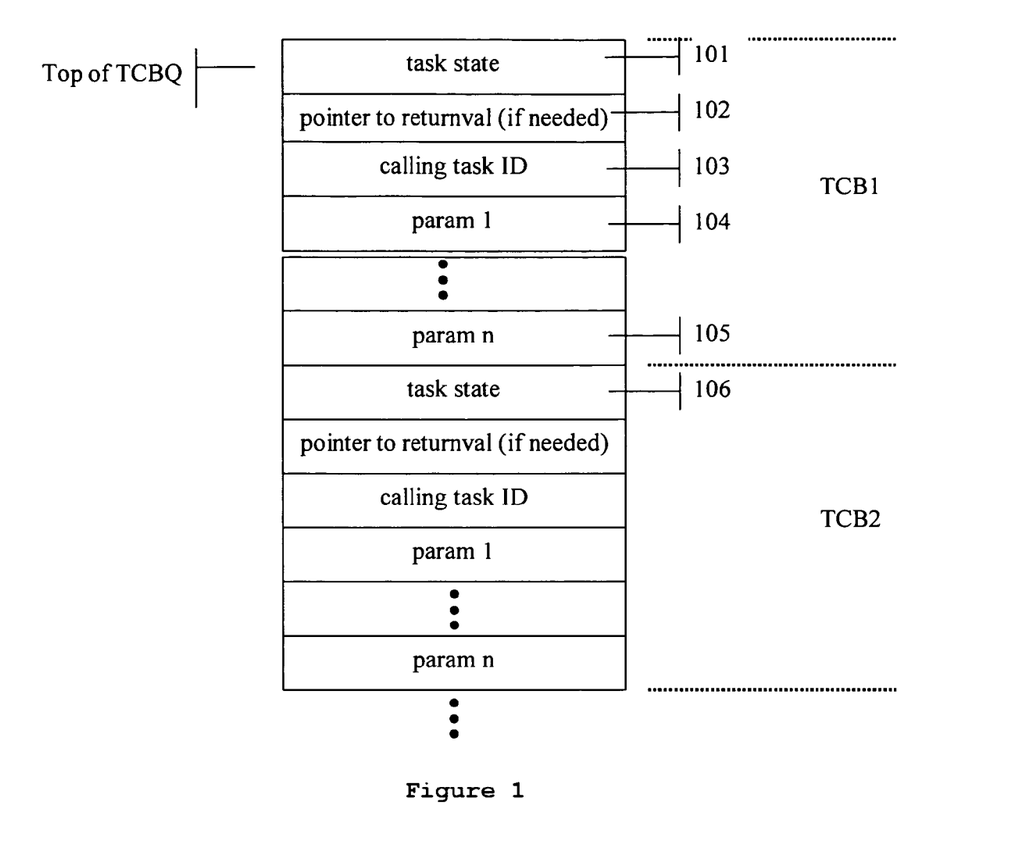
FIG. 1 shows the structure of a task control block queue (TCBQ).

All TCBs associated with a task are queued in a TCB queue (TCBQ) specific to the task. Each time the task is called (i.e., an instance of the task is executed), a new TCB is loaded at the tail of the queue. An exemplary structure of a TCB Queue is shown in FIG. 1. As shown in FIG. 1, at the head of the TCBQ is TCB1, which is the TCB for the currently executing instance of the task, consisting of the task state 101, the pointer to the value returned by the task (if any) 102, the ID 103 of the calling task, and the parameters 104-105 that are passed to the task. FIG. 1 shows TCB2, which is the next TCB in the queue. TCB2 is the next instance of the task to be executed when TCB1 completes. TCB2 has the same structure as TCB1 and starts with the task state 106.

Figure 2:
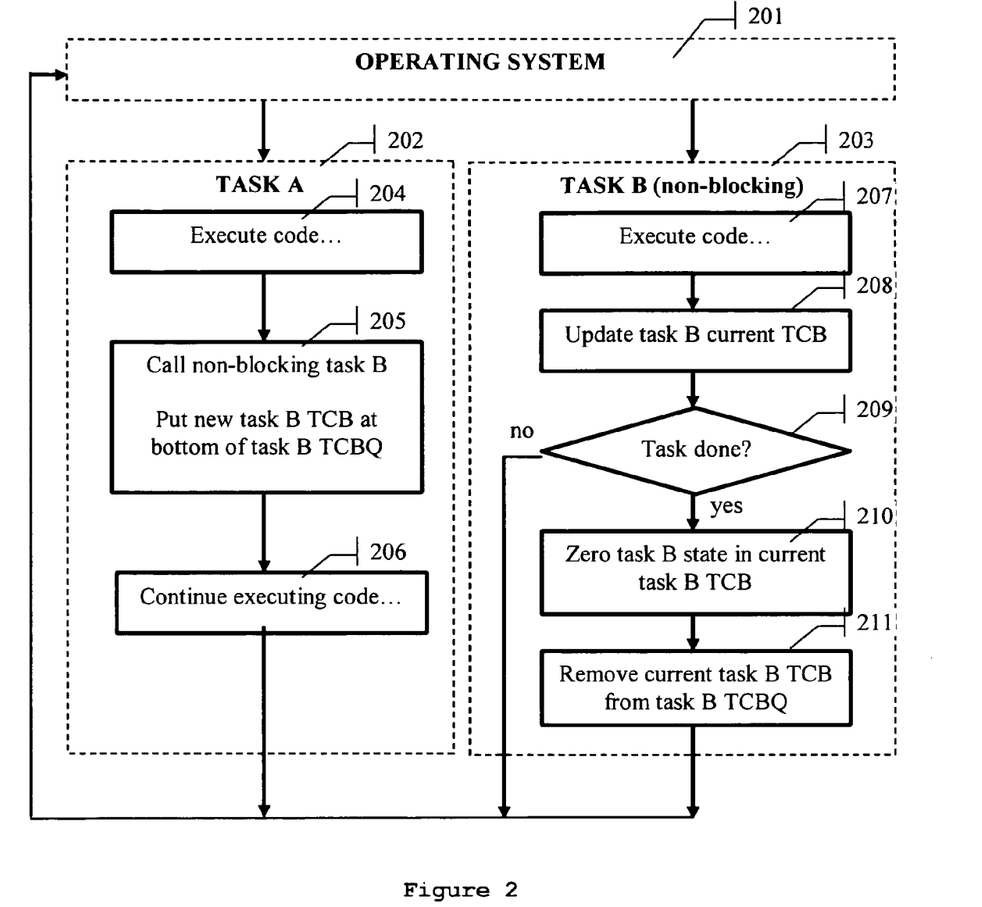
FIG. 2 shows how the TCBQ is adjusted when a task performs a non-blocking call of another task.

FIG. 2 illustrates the operations associated with a non-blocking call of a task. As shown in FIG. 2, at a time after task A 202 is initiated (e.g., after executing the code represented by element 204), task A 202 calls task B 203 using a non-blocking primitive at element 205. To initiate execution of task B 203, at element 205, task A 202 creates a TCB at the tail of the TCBQ for task B 203. Since the call to task B 203 is non-blocking, task A 202 continues to execute as shown in element 206. This new TCB of task B 203 contains the parameters that task A 202 passes to task B 203. For example, this new TCB of task B 203 has a '1' in the task state field to represent the first state of task B 203 and the ID of task A 202 in the field for the calling task ID. When control is returned to operating system 201 by task A 202, and operating system 201 determines that task B 203 can execute, operating system 201 checks for TCBs in the TCBQ of task B 203. If the TCBQ is not empty, operating system 201 transfers control to task B 203, which begins executing code in the context of the TCB at the head of the TCBQ ("current TCB") for task B 203, as shown in element 207. As task B 203 executes code, it updates the task state in its current TCB as shown in element 208. At element 209, if execution of task B 203 in the context of its current TCB is not yet complete, execution is returned to the operating system 201. At element 209, if execution of task B 203 in the context of its current TCB is complete, task B writes a zero into the task state field of its current TCB, as shown in element 210, and removes its current TCB from its TCBQ, as shown in element 211. If the TCBQ for task B 203 is still not empty after the removal of the current TCB, the TCB at the head of the TCBQ for task B 203 becomes the current TCB for task B 203. Note that task A 202 and task B 203 can return control to the operating system 201 multiple times during execution and operating system 201 can return control to task A 202 and task B 203 multiple times during execution before either task A 202 or task B 203 completes.

Figure 3:
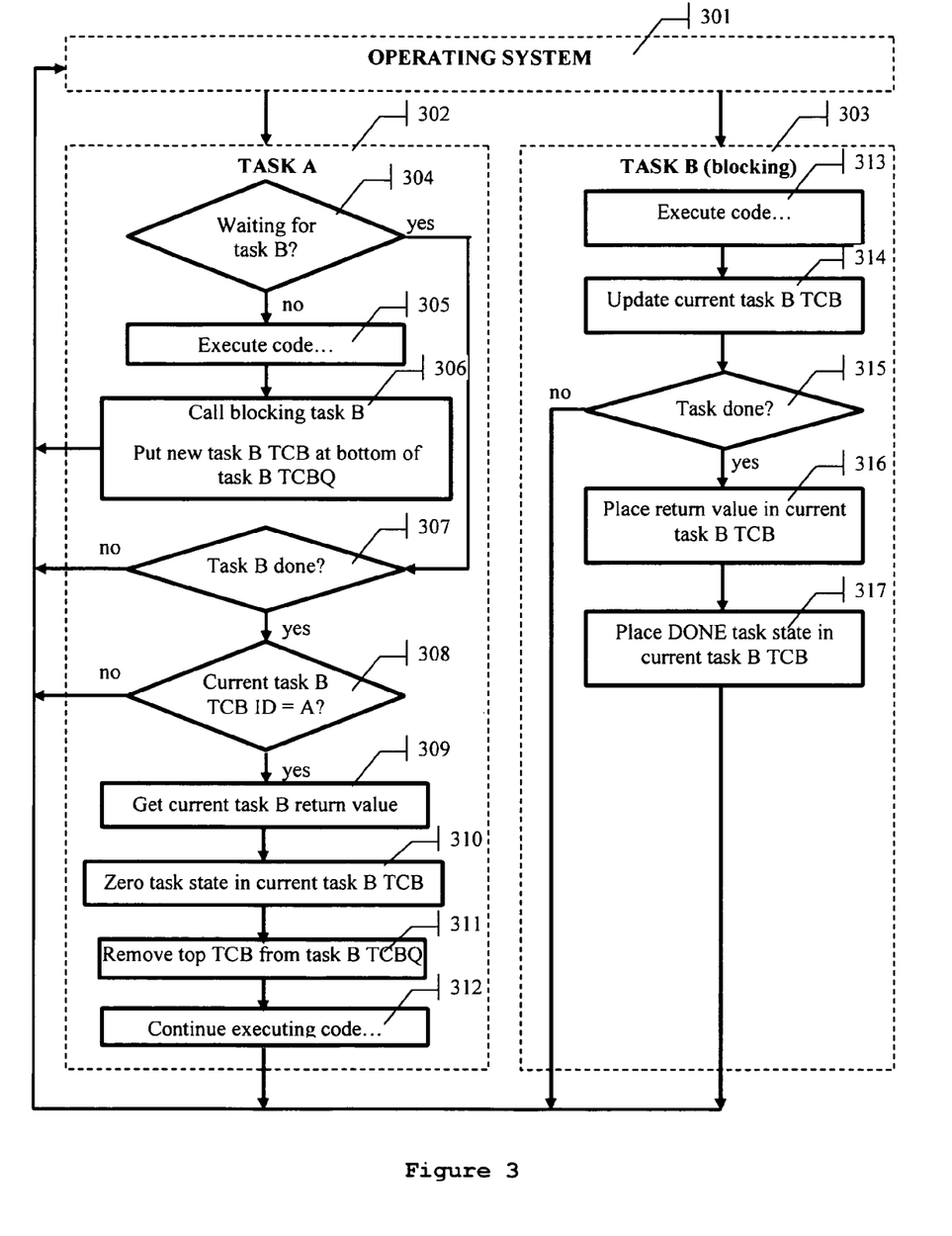
FIG. 3 shows how the TCBQ is adjusted when a task performs a blocking call of another task.

FIG. 3 illustrates the operations associated with calling a task using a blocking primitive. As shown in FIG. 3, task A 302 first determines whether it is blocked because it has previously used a blocking primitive to call task B 303, as shown in element 304. If it is not blocked, task A executes code, as shown in element 305. At element 306, task A 302 requests execution of task B 303 by calling task B 303 using a blocking primitive, which creates a new TCB at the tail of the TCBQ of task B 203 and immediately transfers control to operating system 301. This new TCB contains the parameters that task A 302 passes to task B 303, a task state of '1', which represents the first state of task B 303, and the ID of task A 302.

When operating system 301 determines that task B 303 can execute, operating system 301 checks whether the TCBQ of task B is empty. If not empty, operating system 301 transfers control to task B 303. Task B executes some code in the context of its current TCB, as shown in element 313, and updates the task state in its current TCB, as shown in element 314. At element 315, if execution of Task B 303 in its current context is not yet complete, control is returned to operating system 301. However, at element 315, if execution of task B 303 in its current context is complete, task B 303 places the return value, if any, in its current TCB, as shown in element 316, places a DONE value in the task state field in the current TCB, as shown in element 317, and returns control to operating system 301.

When operating system 301 determines that task A 302 can execute, operating system 301 checks whether the TCBQ of task A 302 is empty. If not empty, operating system 301 transfers control to task A 302 using the TCB at the head of the TCBQ as its current context. When task A 302 resumes execution, it checks whether it is waiting for task B to complete due to execution of the previous blocking primitive as shown in element 304. If task A 302 is waiting for task B 303 to complete, it checks whether task B 303 has completed execution, as shown in element 307, by examining the current TCB of task B 303 for a set DONE flag in the task state field. If task B 303 has not completed, task A 302 returns control to the operating system 301. If task B 303 has completed execution, task A 302 checks whether the ID field in the current TCB matches the ID of task A 302, as shown in element 308. If the IDs do not match, task A 302 transfers control back to operating system 301, as another task is waiting for task B 303 to complete execution in its current context. If the ID in the current TCB of task B 303 does match the ID of task A 302, task A 302 obtains the return value from the current TCB of task B 303, as shown in element 309. Task A 302 then writes a zero into the task state field in the current TCB of task B 303, as shown in element 310, and removes the current TCB from the TCBQ of task B 303, as shown in element 311, and continues executing code after the blocking primitive, as shown in element 312.

If the TCBQ of task B 303 is still not empty, task B 303 executes in the new context of the TCB that is now at the head of the TCBQ of task B 303. Note that task A 302 and task B 303 can return control to operating system 301 many times during execution and operating system 301 can return control to task A 302 and task B 303 many times before either task A 302 or task B 303 completes execution.

5. Source Code Processing

Figure 4:
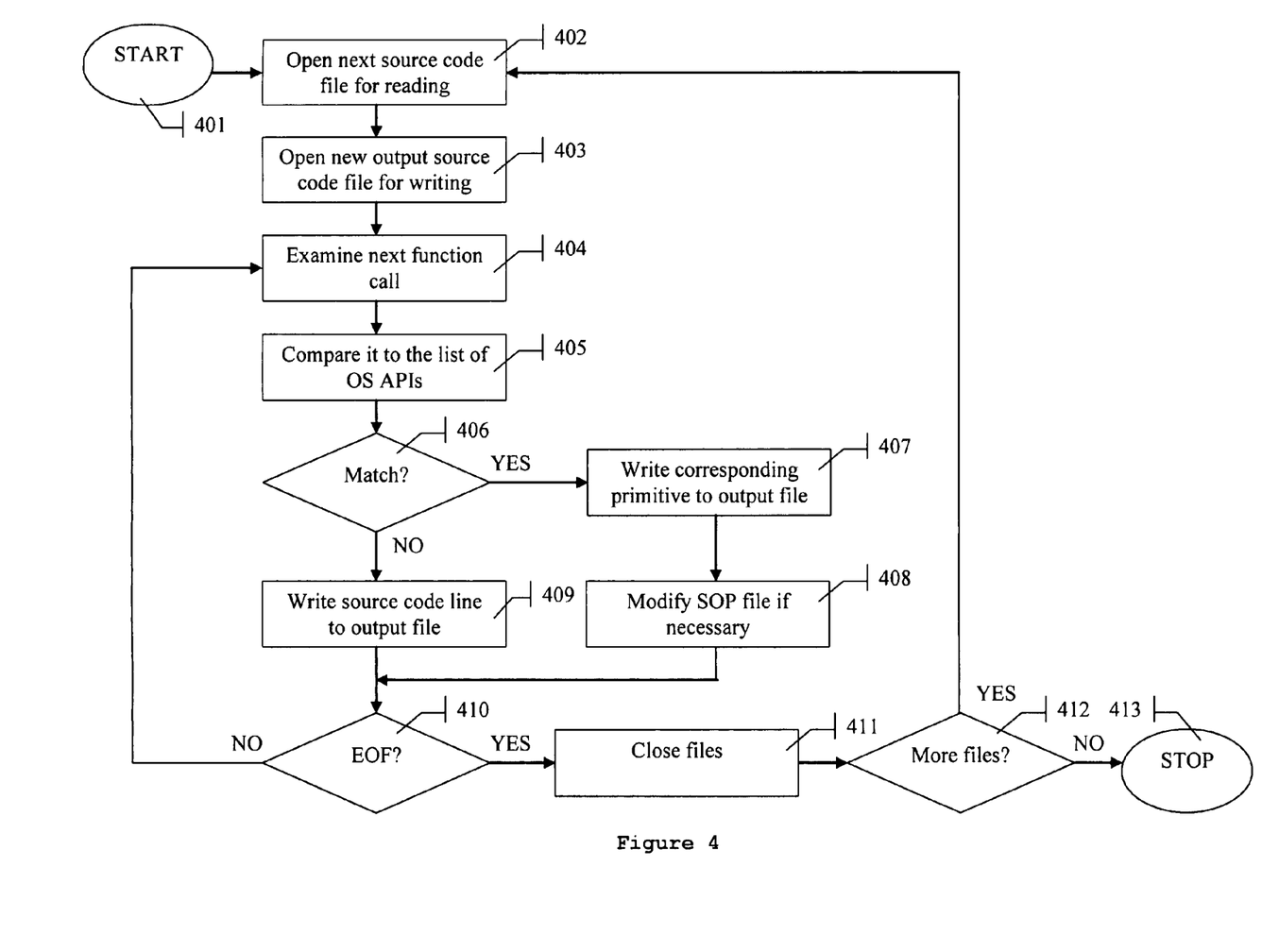
FIG. 4 shows a flow chart for converting operating system specific source code within a task to source code that can be synthesized using a software synthesis program.

Before the source code of a program that includes hardware drivers and application programs can be used as input to a synthesis program such as SynthOS, the source code must be modified to specify task management and task communication using synthesis primitives such as SynthOS primitives. According to one embodiment of the present invention, a source code modification program follows the steps in FIG. 4 to examine source code for various tasks that run on the operating system, including hardware drivers and application programs. Beginning at step 401, when the user specifies the files containing the source code for the tasks, the source code modification program proceeds to step 402 where it opens the first source code file for examination. The program opens a new source code file for writing the modified source code at step 403. At step 404, the source code modification program examines the first function call from the file. Note that each programming statement may consist of none, one, or more function calls. At step 405, the function call read is matched against a list of operating system APIs to determine whether the function call is to be substituted by one or more of the synthesis primitives. If a match is found at step 406, the source code modification program performs the appropriate substitution at step 407, as described later in this disclosure. The modified source code is written to the output file. If a match is found at step 406, the source code modification program performs any necessary changes to the SOP file at step 408, as described later in this disclosure. If no match is found at step 406, the source code modification program copies the original source code to the output file at step 409. At step 410, the source code modification program determines whether the end-of-file (EOF) for the input file has been reached. If not, control returns to step 404. At step 410, if the EOF has been reached, both the input and the output files are closed at step 411. If there are still more source code files to be examined at step 412, the process repeats for the next input file at step 402. If not, at step 413 the source code modification program halts.

Note that in certain cases it may be necessary to make multiple passes through the process for certain source code files in order for the source code modification program to modify code and insert code into the source code files.

6. Exemplary APIs

One common, standard set of APIs, which may be used in the program discussed above in conjunction with FIG. 4, is embodied in the POSIX standard that is used by Linux and other UNIX-type operating systems. In this embodiment, the source code modification program looks specifically for POSIX APIs and substitutes software synthesis primitives and other source code, and in some cases makes modifications to the SOP file.

Figure 5:
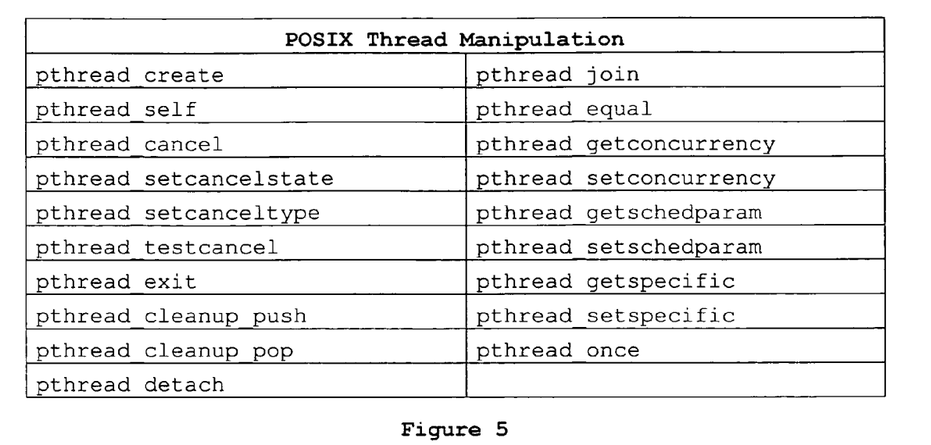
FIG. 5 is a table of POSIX Thread Manipulation APIs.

When determining how to make the appropriate substitution, the source code modification program divides the APIs into categories. The first category is thread manipulation APIs. Threads are programs or functions that run concurrently on top of an operating system, and correspond to drivers and applications. The terms "thread" and "task" may be used interchangeably below. A table of thread manipulation APIs is shown in FIG. 5.

(a) Thread Manipulation APIs

---
(i) int pthread_create(pthread_t *, const
pthread_attr_t *, void *(*)(void *), void *)
---

The pthread_create API is the thread-creation system call. For software synthesis, threads are allocated statically at compile time, but POSIX only allows one thread to be created statically, namely the thread that executes main( ). Thus, the source code modification program scans the source code looking for pthread_create( ) APIs. The function specified in the third parameter will then be assumed to be a Call task and replaced with a SynthOS_call or SynthOS_start primitive depending on whether the function returns a value or not. Also the SOP file will be modified to specify the function as a Call task. The thread implementing main( ) will thus be the only Loop task in the system.

(ii) pthread_t pthread_self(void)

The pthread_self API provides a way for a thread to access the data structure that represents itself. A field in the TCB points to the pthread_t data structure, enabling the source code modification program to substitute this system call with a macro that uses SynthOS_tcb->pthread.

---
(iii) int pthread_cancel(pthread_t)
int pthread_setcancelstate(int, int *)
int pthread_setcanceltype(int, int *)
void pthread_testcancel(void)
void pthread_exit(void *)
---

The first four of these system APIs, referred to as "cancel" system calls, are the POSIX system calls to terminate threads. The pthread_exit API, also referred to as the "exit" system call, allows a thread to terminate itself. The source code modification program substitutes the SynthOS_terminate primitive for these APIs.

|      |                                                              |
| ---- | ------------------------------------------------------------ |
| (iv) | void pthread_cleanup_push(void*), void *);<br>void pthread_cleanup_pop(int) ; |

These "cleanup" APIs allow cleanup handlers to be attached to threads. The cleanup APIs are automatically called when the associated thread is terminated. Cleanup APIs are infrequently used and add complexity. In many applications, synthesis for cleanup APIs is not necessary and the source code modification program eliminates these APIs and issues a warning to the user.

|     |                                                              |
| --- | ------------------------------------------------------------ |
| (v) | int pthread_detach(pthread_t);<br>int pthread_join(pthread_t, void **); |

The pthread_detach and pthread_join APIs control whether or not a thread can wait for another to complete and are similar to the SynthOS_wait primitive. The source code modification program substitutes a SynthOS_wait primitive.

(vi) int pthread_equal(pthread_t, pthread_t);

The pthread_equal API checks for equality of two thread data structures and the source code modification program substitutes a simple macro.

|       |                                                              |
| ----- | ------------------------------------------------------------ |
| (vii) | int pthread_getconcurrency(void);<br>int pthread_setconcurrency(int); |

The pthread_getconcurrency and pthread_setconcurrency APIs are not necessary in some environments. In those environments the source code modification program removes these system calls and issues a warning to the user.

|        |                                                              |
| ------ | ------------------------------------------------------------ |
| (viii) | int pthread_getschedparam(pthread_t, int *,<br>    struct sched_param *);<br>int pthread_setschedparam(pthread_t, int , const<br>    struct sched_param *); |

The pthread_getschedparam and pthread_setschedparam APIs allow control of scheduling policies and priorities. Because SynthOS does not allow changing scheduling policies and priorities at run time, the source code modification program removes these APIs and issues a warning to the user. In an alternate embodiment, SynthOS allows changing scheduling policies and priorities at run time and the source code modification program substitutes code to set global variables representing scheduling policies and priorities for the operating system.

|      |                                                    |
| ---- | -------------------------------------------------- |
| (ix) | int pthread_once(pthread_once_t *, void<br>    (*)(void)); |

The pthread_once API is similar to executing an Init task except that the initialization can take place at any time. The source code modification program implements the pthread_once system call by specifying the called task as a Call task and creating code for a global Boolean flag that is initialized to 0 by the Call task, and set to 1 when the Call task completes. The source code modification program substitutes a SynthOS_call primitive and inserts source code in the Call task to check this Boolean flag and only execute if the flag is 0. The source code modification program also modifies the SOP file to declare the called task as a Call task.

Figure 6:
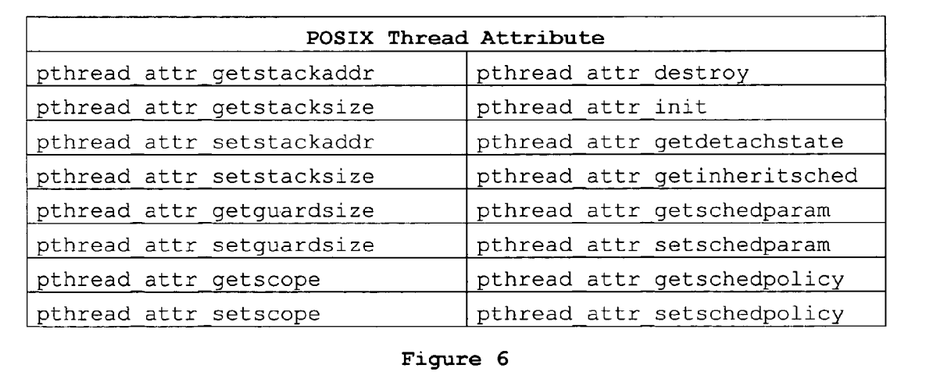
FIG. 6 is a table of POSIX Thread Attribute APIs.

Another API category is thread attribute APIs. A table of thread attribute APIs is shown in FIG. 6.

(b) Thread Attributes

|     |                                                              |
| --- | ------------------------------------------------------------ |
| (i) | int pthread_attr_getstackaddr(const pthread_attr_t<br>    *, void **);<br>int pthread_attr_getstacksize(const<br>    pthread_attr_t *, size_t *);<br>int pthread_attr_setstackaddr(pthread_attr_t *,<br>    void *);<br>int pthread_attr_setstacksize(pthread_attr_t *,<br>    size_t);<br>int pthread_attr_getguardsize(const<br>    pthread_attr_t *, size_t *);<br>int pthread_attr_setguardsize(pthread_attr_t *,<br>    size_t); |

The attributes manipulated by the APIs are not meaningful in a single-stack environment like the RTOS synthesized by SynthOS. The source code modification program produces an error message to the user when it comes across these APIs.

|      |                                                              |
| ---- | ------------------------------------------------------------ |
| (ii) | int pthread_attr_getscope(const pthread_attr_t *,<br>    int *);<br>int pthread_attr_setscope(pthread_attr_t *, int); |

In a single-process environment (i.e., a single-scope environment) like the RTOS generated by SynthOS, these APIs simply return reasonable values. The source code modification program replaces these APIs with simple functions that get and set global variables.

|     |                                                              |
| --- | ------------------------------------------------------------ |
|     | int pthread_attr_destroy(pthread_attr_t *);<br>int pthread_attr_init(pthread_attr_t *); |

The pthread_attr init API simply initializes a pthread_attr data structure to its default values. The pthread_attr_destroy API does nothing on Linux, so the source code modification program removes these APIs.

|      |                                                              |
| ---- | ------------------------------------------------------------ |
| (iv) | int pthread_attr_getdetachstate(const<br>    pthread_attr_t *, int *);<br>int pthread_attr_getinheritsched(const<br>    pthread_attr_t *, int *);<br>int pthread_attr_getschedparam(const<br>    pthread_attr_t *, struct sched_param *);<br>int pthread_attr_setschedparam(pthread_attr_t *,<br>    const struct sched_param *);<br>int pthread_attr_getschedpolicy(const<br>    pthread_attr_t *, int *);<br>int pthread_attr_setschedpolicy(pthread_attr_t *,<br>    int); |

These "get" and "set" APIs simply fetch or set fields in the thread data structure. The source code modification program implements them as macros.

Figure 7:
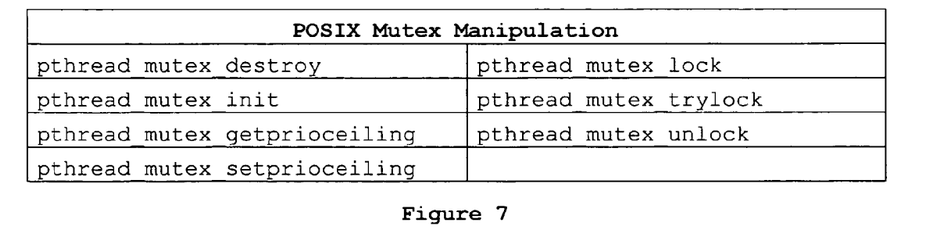
FIG. 7 is a table of POSIX Mutex Manipulation APIs.

Another API category is mutex manipulation APIs. A table of mutex manipulation APIs is shown in FIG. 7.

(c) Mutex Manipulation

| | |
|---|---|
| (i) | int pthread_mutex_destroy(pthread_mutex_t *);<br>int pthread_mutex_init(pthread_mutex_t *, const pthread_mutexattr_t *); |

The pthread_mutex_init and pthread_mutex_destroy APIs are used to allocate and free memory used by mutexes. The source code modification program removes these APIs because the mutex implementation used by SynthOS requires very little memory.

| | |
|---|---|
| (ii) | int pthread_mutex_getprioceiling(const pthread_mutex_t *, int *);<br>int pthread_mutex_setprioceiling(pthread_mutex_t *, int, int *);<br>int pthread_mutex_lock(pthread_mutex_t *);<br>int pthread_mutex_trylock(pthread_mutex_t *);<br>int pthread_mutex_unlock(pthread_mutex_t *); |

These mutex APIs are the core functions of the mutex. The source code modification program substitutes them with the SynthOS_wait primitive.

Figure 8:
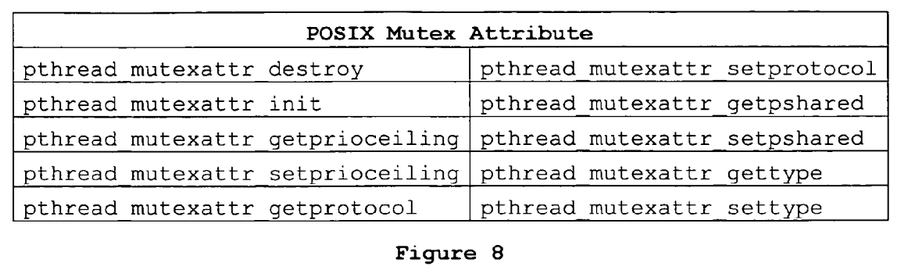
FIG. 8 is a table of POSIX Mutex Attribute APIs.

Another API category is mutex attribute APIs. A table of mutex attribute APIs is shown in FIG. 8.

(d) Mutex Attributes

| | |
|---|---|
| (i) | int pthread_mutexattr_destroy(pthread_mutexattr_t *);<br>int pthread_mutexattr_init(pthread_mutexattr_t *); |

The pthread_mutexattr_init API simply initializes a pthread_mutexattr_t data structure to its default values. The pthread_mutexattr_destroy API does nothing on Linux, so the source code modification program removes these APIs.

| | |
|---|---|
| (ii) | int pthread_mutexattr_getprioceiling(const pthread_mutexattr_t *, int *);<br>int pthread_mutexattr_setprioceiling(pthread_mutexattr_t *, int);<br>int pthread_mutexattr_getprotocol(const pthread_mutexattr_t *, int *);<br>int pthread_mutexattr_setprotocol(pthread_mutexattr_t *, int);<br>int pthread_mutexattr_getpshared(const pthread_mutexattr_t *, int *);<br>int pthread_mutexattr_setpshared(pthread_mutexattr_t *, int);<br>int pthread_mutexattr_gettype(const pthread_mutexattr_t *, int *);<br>int pthread_mutexattr_settype(pthread_mutexattr_t *, int); |

These eight mutex attribute APIs simply fetch or set fields in the mutexattr data structure. The source code modification program substitutes macros.

Figure 9:
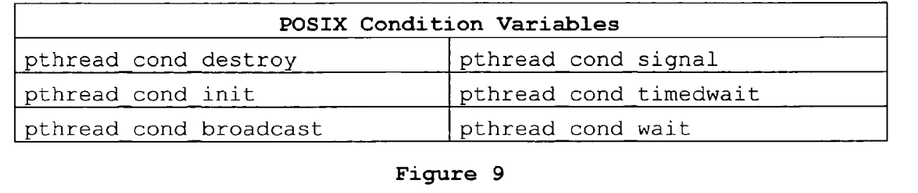
FIG. 9 is a table of POSIX Condition Variables APIs.

Another API category is condition variable APIs. A table of condition variable APIs is shown in FIG. 9.

(e) Condition Variables

| | |
|---|---|
| (i) | int pthread_cond_destroy(pthread_cond_t *);<br>int pthread_cond_ini(pthread_cond_t *, const pthread_condattr_t *); |

The pthread_cond_init API simply initializes a pthread_cond_t data structure to its default values. The pthread_cond_destroy API does nothing on Linux, so the source code modification program removes these APIs.

| | |
|---|---|
| (ii) | int pthread_cond_broadcast(pthread_cond_t *);<br>int pthread_cond_signal(pthread_cond_t *);<br>int pthread_cond_timedwait(pthread_cond_t *, pthread_mutex_t *, const struct timespec *);<br>int pthread_cond_wait(pthread_cond_t *, pthread_mutex_t *); |

These four condition APIs are the core functions of condition variables. The source code modification program substitutes the SynthOS_wait primitive.

Figure 10:
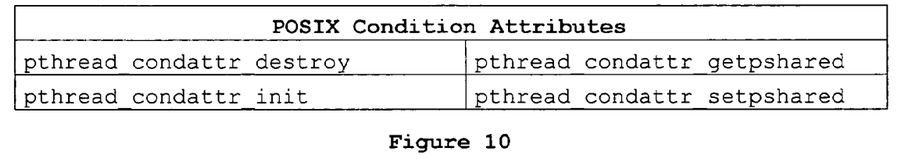
FIG. 10 is a table of POSIX Condition Attributes APIs.

Another API category is condition attribute APIs. A table of condition attribute APIs is shown in FIG. 10.

(f) Condition Attributes

| | |
|---|---|
| | (i) int pthread_condattr_destroy(pthread_condattr_t *);<br>int pthread_condattr_init(pthread_condattr_t *); |

The pthread_condattr_init API simply initializes a pthread_condattr_t data structure to its default values. The pthread_condattr_destroy API does nothing on Linux, so the source code modification program removes these APIs.

| | |
|---|---|
| (ii) | int pthread_condattr_getpshared(const pthread_condattr_t *, int *);<br>int pthread_condattr_setpshared(pthread_condattr_t *, int); |

These two condition attribute APIs simply fetch or set fields in the condattr data structure. The source code modification program substitutes macros.

Figure 11:
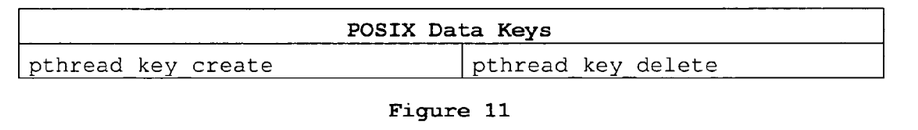
FIG. 11 is a table of POSIX Data Keys APIs.

Another API category is data key APIs. A table of data key APIs is shown in FIG. 11.

(g) Data Keys

| | |
|---|---|
| | (i) int pthread_key_create(pthread_key_t *, void (*)(void *));<br>int pthread_key_delete(pthread_key_t); |

The pthread_key_create and pthread_key_delete APIs are used with the pthread_setspecific( ) and pthread_getspecific( ) APIs to provide a mini-database for threads. The source code modification program substitutes macros.

Figure 12:
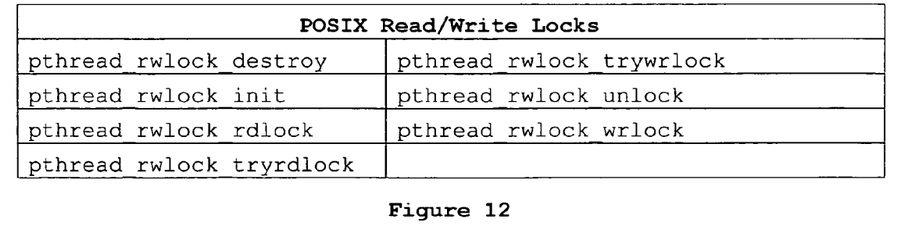
FIG. 12 is a table of POSIX Read/Write Locks APIs.

Another API category is read/write lock APIs. A table of read/write lock APIs is shown in FIG. 12.

(h) Read/Write Locks

```
(i) int pthread_rwlock_destroy(pthread_rwlock_t *);
    int pthread_rwlock_init(pthread_rwlock_t *, const
        pthread_rwlockattr_t *);
```

The pthread_rwlock_init API simply initializes a pthread_rwlock_t data structure to its default values. The pthread_rwlock_destroy API does nothing on Linux, so the source code modification program removes these APIs.

```
(ii)    int pthread_rwlock_rdlock(pthread_rwlock_t *);
        int pthread_rwlock_tryrdlock(pthread_rwlock_t *);
        int pthread_rwlock_trywrlock(pthread_rwlock_t *);
        int pthread_rwlock_unlock(pthread_rwlock_t *);
        int pthread_rwlock_wrlock(pthread_rwlock_t *);
```

These five lock functions are the core functions of read/write lock variables. The source code modification program substitutes the SynthOS_wait primitive.

Figure 13:
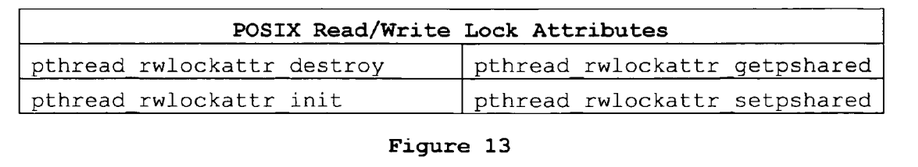
FIG. 13 is a table of POSIX Read/Write Lock Attributes APIs.

Another API category is read/write lock attribute APIs. A table of read/write lock attribute APIs is shown in FIG. 13.

(j) Read/Write Lock Attributes

```
(i) int pthread_rwlockattr_destroy(
        pthread_rwlockattr_t *);
    int pthread_rwlockattr_init(pthread_rwlockattr_t *);
```

The pthread_rwlockattr_init API simply initializes a pthread_rwlock_t data structure to its default values. The pthread_rwlockattr_destroy API does nothing on Linux, so the source code modification program removes these APIs.

```
(ii) int pthread_rwlockattr_getpshared(const
        pthread_rwlockattr_t *, int *);
        int pthread_rwlockattr_setpshared(
        pthread_rwlockattr_t *, int);
```

These two read/write lock attribute functions simply fetch or set fields in the rwlockattr data structure and the source code modification program substitutes macros.

Using the substitutions and modifications described above, hardware drivers and application programs may be converted for use with SynthOS or a SynthOS-like synthesis program. The modified source code may then be provided to a synthesis tool to synthesize code for compilation into an RTOS.

Various modifications and adaptations to the embodiments described here are apparent to those skilled in the art based on the discussion in the above detailed disclosure. Many variations and modifications within the scope of the invention are therefore possible. The present invention is set forth in the following claims.

We claim:

1. A method for customizing and synthesizing real time operating system source code, the method comprising:
providing a processor and a memory, in data communication with the processor;
providing a synthesis configuration file being provisioned to provide a listing of real time tasks and their attributes, the synthesis configuration file being used by a software synthesis program;
providing synthesis primitives to be placed in source code of a plurality of real time tasks, the synthesis primitives being configured to provide task management and synchronization among the plurality of real time tasks, the synthesis primitives being understood by the software synthesis program;
searching, by use of the processor and the memory, the source code of the plurality of real time tasks for operating system application programming interfaces (APIs) or task communication data structures;
substituting in the source code at least one of the synthesis primitives for the APIs or the data structures;
synthesizing source code for the substituted synthesis primitives using the software synthesis program and relying at least in part on information in the synthesis configuration file; and
converting, for execution by a computer, the source code including the synthesized source code.

2. The method of claim 1 wherein the APIs include thread manipulation APIs.

3. The method of claim 1 wherein the APIs include functions for achieving shared access to system resources.

4. An apparatus for customizing and synthesizing real time operating system source code, the apparatus comprising:
a processor and a memory in data communication with the processor;
means for providing a synthesis configuration file being provisioned to provide a listing of real time tasks and their attributes, the synthesis configuration file being used by a software synthesis program;
means for providing synthesis primitives to be placed in source code of a plurality of real time tasks, the synthesis primitives being configured to provide task management and synchronization among the plurality of real time tasks, the synthesis primitives being understood by a software synthesis program;
means for searching, by use of the processor and the memory, the source code of the plurality of real time tasks for operating system application programming interfaces (APIs) or task communication data structures;
means for substituting in the source code at least one of the synthesis primitives for the APIs or the data structures;
means for synthesizing source code for the substituted synthesis primitives using the software synthesis program and relying at least in part on information in the synthesis configuration file; and
means for converting, for execution by a computer, the source code including the synthesized source code.

5. The apparatus of claim 4 wherein the APIs include thread manipulation APIs.

6. The apparatus of claim 4 wherein the APIs include functions for achieving shared access to system resources.

* * * * *